(12) United States Patent
Tuan et al.

(10) Patent No.: US 6,710,589 B2
(45) Date of Patent: Mar. 23, 2004

(54) DIAGNOSTIC ADAPTOR WITH THREADLESS DOCKING FIXTURE

(75) Inventors: Yung-Chi Tuan, Taipei (TW); Jewin Chang, Jungli (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 37 days.

(21) Appl. No.: 10/175,115

(22) Filed: Jun. 19, 2002

(65) Prior Publication Data

US 2003/0234643 A1 Dec. 25, 2003

(51) Int. Cl.[7] .............................................. G01R 31/02
(52) U.S. Cl. ................................................... 324/158.1
(58) Field of Search .......................... 324/73.1, 754–755, 324/758, 158.1; 73/865.8, 866.5; 414/590

(56) References Cited

U.S. PATENT DOCUMENTS 6,407,541 B1 * 6/2002 Hannan et al. .......... 324/158.1
6,586,925 B2 * 7/2003 Ramesh et al. .......... 324/158.1
6,617,867 B2 * 9/2003 Bruno et al. ................ 374/758

* cited by examiner

Primary Examiner—Evan Pert
Assistant Examiner—Minh N. Tang
(74) Attorney, Agent, or Firm—Tung & Associates

(57) ABSTRACT

A threadless docking fixture for removably mounting a test device in functional electrical engagement with a test head on a parametric semiconductor wafer testing system. The threadless docking fixture comprises a housing in which is mounted the test device. The housing is fitted with a pivoting lock handle which terminates in a pair of lock plates rotatably attached to opposite sides of the housing. An arcuate lock flange on each lock plate us removably engages a lock rod which extends from a corresponding one of a pair of anchor plates which are mounted on the test head of the wafer testing system. Accordingly, each lock flange engages the corresponding lock rod and the test device is mounted in functional electrical engagement with the test head as the handle is pivoted from an unlock to a lock position.

20 Claims, 3 Drawing Sheets

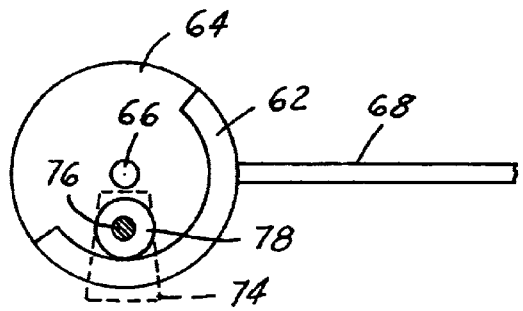
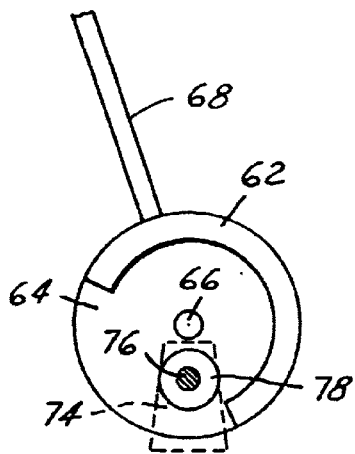
FIG.7A          FIG.7B
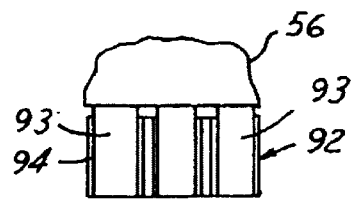
FIG. 8A
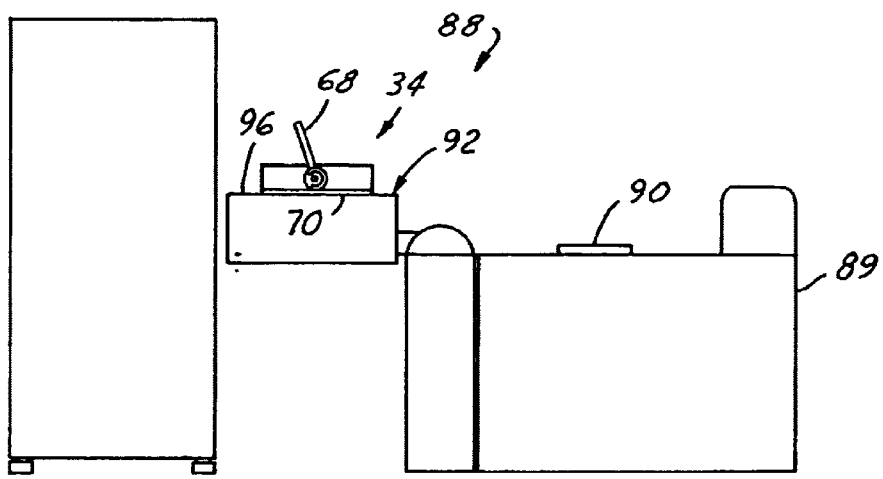
FIG. 8

DIAGNOSTIC ADAPTOR WITH THREADLESS DOCKING FIXTURE

FIELD OF THE INVENTION

The present invention relates to parametric testing machines used in testing electrical characteristics of integrated circuits fabricated on a semiconductor wafer substrate. More particularly, the present invention relates to a parametric testing system diagnostic adaptor having a threadless docking fixture for removably attaching the adaptor to the test head of the system.

BACKGROUND OF THE INVENTION

A conventional method used by the semiconductor industry in the manufacturing of semiconductor integrated circuits includes the steps of fabrication, wafer sort, assembly and test, respectively. In the fabrication step, as many as several thousand dies (integrated circuits) are formed onto a semiconductor wafer. In the wafer sort step, each of the dies on the wafer is tested to determine its electrical characteristics and operability, and defective dies are distinguished from operable dies. The defective dies are often marked by an ink mark at the wafer sorting step. In the assembly step, the unmarked,operable dies are assembled into a package, and in the test step, the packaged integrated circuits are tested for operability and reliability.

At the wafer sort step, the dies are tested to establish which dies on the wafer function properly. Each die is tested to all functional product specifications for both DC and AC parameters. Four testing objectives are pursued: (1) chip functionality, in which all chip functions are tested to ensure that only fully-functional chips are assembled and packaged in subsequent steps; (2) chip sorting, in which chips are separated or sorted on the basis of their operating speed performance under various voltage and timing conditions; (3) fab yield response, which yields important information that may lead to improvements in the overall fabrication process; and (4) test coverage, in which high test coverage of the internal device nodes is achieved at the lowest possible cost. The wafer sort procedure is similar to the in-line parametric test except that every die on the wafer is tested, in many cases using the same automated test equipment (ATE). Furthermore, the wafer sort procedure is usually located in a separate facility under less stringent purity conditions than those in which the parametric test is carried out, since wafer fabrication is essentially complete.

In automated wafer handling during wafer sort, a correlation wafer is used to verify tester setup. The correlation wafer is a control wafer the functionality of which has been verified and ensures that the testing system is working properly. After indexing from the cassette to the prober, the wafers are mounted on a vacuum chuck with Z (vertical) positioning. Using software, mechanical probe needles are aligned and contacted with bond pads on the wafer to establish electrical communication between a testing equipment and the dies on the wafer. The probes are interfaced with the ATE to perform the range of AC functional tests based on test algorithms. The type, number and order of tests are defined by the test program.

After testing, die found to be defective are labeled in a computer database to exclude the die from subsequent packaging steps. The labeling method is typically performed by placing a drop of ink on each unacceptable die. Because the ink marking process can be messy and introduce possible contaminants onto the chip, electronic wafer maps are increasingly being used to create a computer image of chip location and test results to categorize good and bad die on the wafer. At the chip assembly stations, the electronic wafer maps are downloaded into an equipment database to ensure that defective chips will not be packaged.

FIGS. 1 and 2 illustrate a conventional parametric wafer testing system, generally indicated by reference numeral 10. The wafer testing system 10 includes a base 12 on which is mounted a wafer chuck 14 for supporting a semiconductor wafer 16 thereon and testing dies or integrated circuits on the wafer 16. A test head 18 is connected to the base 12 by means of a hinge 20. As illustrated in FIG. 2, a test face 22 on the test head 18 includes multiple pin receptacles 24 which are arranged in concentric rows and are adapted to receive pins (not illustrated) provided in electrical contact with the circuits or dies on the wafer 16. The test head 18 is operated to conduct electrical signals between the pins of the integrated circuit package and the testing equipment (not shown) to facilitate testing of the integrated circuit package in conventional fashion.

Typically, the test head 18 requires periodic testing to ensure proper functioning of the system 10. This is accomplished by the use of a test device 26, which may be a relay test adapter such as an HP 16075A, a system test module such as an HP 16076A, or a test fixture adapter such as an HP 16066A. As shown in FIG. 3A, the test device 26 includes a test face 27 having multiple test pins 28 which are arranged in concentric rows and match the positions of the respective pin receptacles 24 of the test head 18. Fastener openings 30 extend through the test device 26 at respective corners thereof. Accordingly, the test device 26 is removably attached to the test head 18 by inserting the test pins: 28 of the test device 26 in the respective pin receptacles 24 of the test head 18; extending threaded fasteners 32 through respective fastener openings 30 in the test device 26; and threadably seating the fasteners 32 in respective fastener openings 23 in the test surface 22 of the test head 18, as illustrated in FIG. 3. The threaded fasteners 32 mount the test device 26 against the test head 18 with a force typically equal to about 7.5 kg to maintain firm electrical contact between the test pins 28 of the test device 26 and the pin receptacles 24 of the test head 18. After testing of the test head 18, the test device 26 is removed from the test head 18 after unthreading the fasteners 32 from the fastener openings 23 in the test head 18.

As the fasteners 32 are unthreaded from the fastener openings 23, small metal particles or shavings from the fasteners 32 tend to remain in the fastener openings 23 or fall on the test face 22 of the test head 18. This causes some of the particles or shavings to fall into the pin receptacles 24, thereby modifying or attenuating transmission of electrical current between the test pins of the integrated circuit package (not illustrated) on a wafer 14 and the pin receptacles 24 in the test head 18. This may render faulty the testing process for the integrated circuits on the wafer 14.

Accordingly, a threadless docking fixture is needed to art facilitate removably mounting a test device to a test head of a parametric wafer testing system in order to prevent the metal particle contamination which is a common drawback of using conventional threaded fastener techniques for mounting the test device on the test head.

An object of the present invention is to provide a device for removably mounting a test device on a test head of a wafer testing system.

Another object of the present invention is to provide a device which is capable of removably attaching a test device on a test head of a wafer testing system without contaminating the test head.

Still another object of the present invention is to provide a threadless docking fixture for a test device used in testing a wafer testing system, which threadless docking fixture utilizes a threadless mechanism for mounting in order to prevent metal particle contamination of the test device or wafer testing system.

A still further object of the present invention is to provide a threadless docking fixture which prevents metal particle contamination of a wafer testing procedure.

Yet another object of the present invention is to provide a threadless docking fixture which is characterized by simple construction and ease of use.

A still further object of the present invention is to provide a threadless docking fixture which contributes to cleanroom standards for a semiconductor fabrication facility.

SUMMARY OF THE INVENTION

In accordance with these and other objects and advantages, the present invention comprises a threadless docking fixture for removably mounting a test device in functional electrical engagement with a test head on a parametric semiconductor wafer testing system. The threadless docking fixture comprises a housing in which is mounted the test device. The housing is fitted with a pivoting lock handle which terminates in a pair of lock plates rotatably attached to opposite sides of the housing. An arcuate lock flange on each lock plate removably engages a lock rod which extends from a corresponding one of a pair of anchor plates which 14 are mounted on the test head of the wafer testing system. Accordingly, each lock flange engages the corresponding lock rod and the test device is mounted in functional electrical engagement with the test head as the handle is pivoted from an unlock to a lock position. The test device and docking fixture are removed from the test head after pivoting the handle from the lock to the unlock position, thereby disengaging each lock flange from the corresponding lock rod.

BRIEF DESCRIPTION OF THE DRAWINGS

The present invention will now be described, by way of example, with reference to the accompanying drawings, in which:

FIG. 7A illustrates the lock flange in locking engagement with the lock rod in implementation of the present invention;

FIG. 7B illustrates the lock flange in unlocking disengagement with the lock rod in implementation of the present invention;

FIG. 8 illustrates the docking fixture of the present invention removably mounted on a test head of a wafer testing system; and FIG. 8A illustrates engagement of the test pins of the test device with the pin receptacles of the test head in a typical testing or diagnostic procedure for the wafer testing system.

DESCRIPTION OF THE PREFERRED EMBODIMENTS

Figure 1:
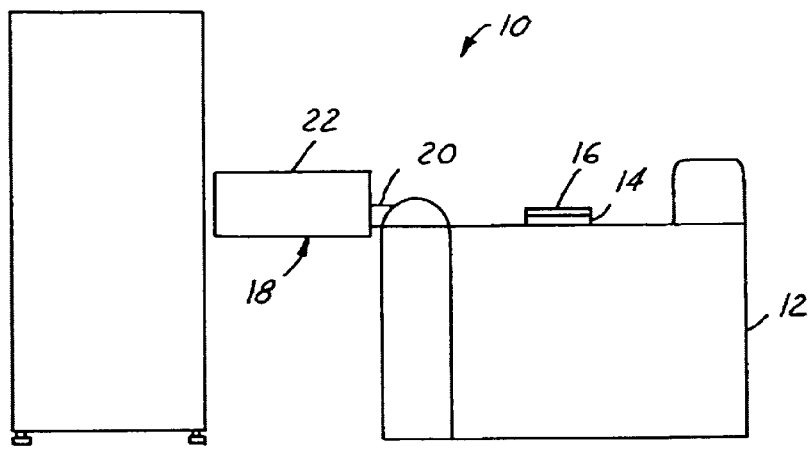
FIG. 1 is a side view of a typical conventional parametric wafer testing system suitable for implementation of the present invention
Figure 2:
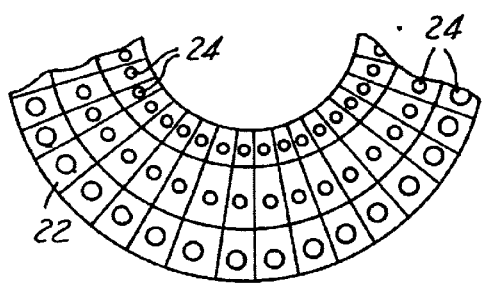
FIG. 2 illustrates multiple pin receptacles in a test head of a parametric wafer testing system.
Figure 3A:
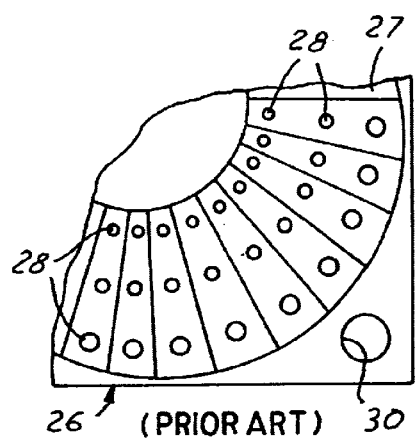
FIG. 3A illustrates multiple test pins extending from a test device for a test head.
Figure 3:
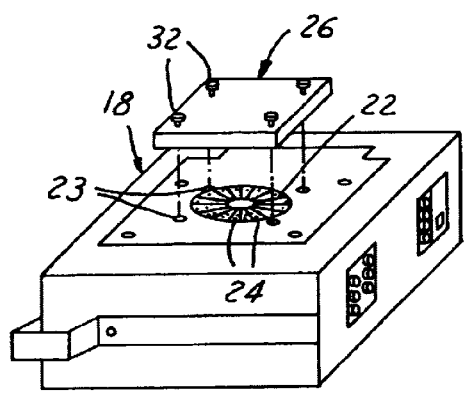
FIG. 3 illustrates removable attachment of a test device to a test head of a wafer testing system using conventional threaded fasteners.
Figure 4:
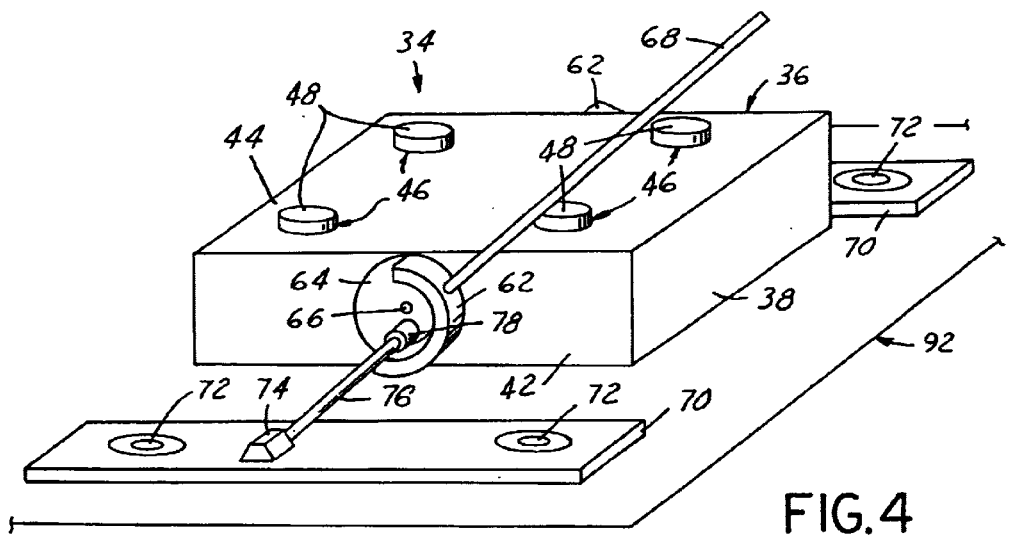
FIG. 4 is a perspective view of a docking fixture of the present invention, removably mounted on a test head.

Referring to FIGS. 4–8A, an illustrative embodiment of the docking fixture of the present invention is generally indicated by reference numeral 34 in FIG. 4. The docking fixture 34 is designed to removably mount a test device 56 (FIG. 5) on a test head 92 of a wafer testing system 88, with the test face 57 of the test device 56 in functional electrical engagement with the test face 96 of the test head 92, as illustrated in phantom in FIG. 5 and hereinafter further described. The wafer testing system 88 may be a standard HP Agilent 4062 series parametric wafer tester, for example, having a base 89 to which the test head 92 is hingedly mounted and which supports a wafer chuck 90. The test device 56 may be a testing or diagnostic device for testing or diagnosing various operational parameters or malfunctions associated with the wafer testing system 88, such as an HP 16075A relay test adaptor, an HP 16076A system test module, or an HP 16066A test fixture adapter.

The docking fixture 34 includes a pair of elongated anchor plates 70 which are mounted on the test head 92 using mount bolts or other appropriate fasteners 72, with the test face 96 (FIG. 5) of the test head 92 between the anchor plates 70. A rod clamp 74 (one of which is illustrated in FIG. 4) is mounted on the upper surface of each anchor plate 70, and a lock rod 76 extends from each rod clamp 74. A cylindrical, typically rubber or plastic lock rod shoe 78 may be mounted on the extending end of each lock rod 76.

Figure 5:
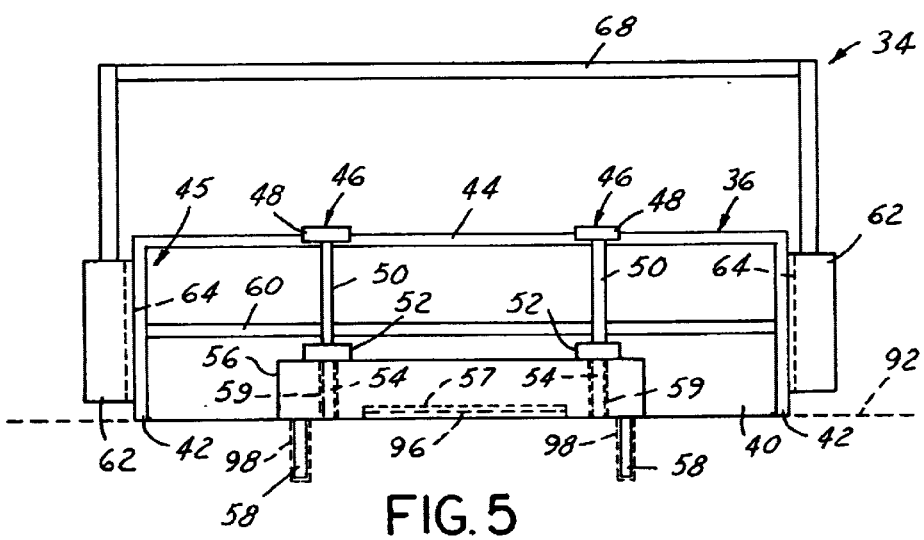
FIG. 5 is a front view of the docking fixture of FIG. 4, with the front housing panel component of the docking fixture removed.
Figure 6:
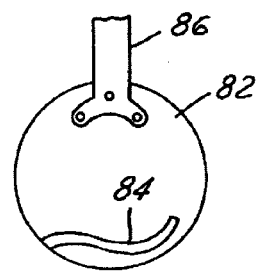
FIG. 6 illustrates an alternative configuration for the lock plate and lock flange components of a docking fixture of the present invention.

The docking fixture 34 further includes a support support housing 36, typically including a front housing panel 38, side housing panels 42, a rear housing panel 40 (FIG. 5) and a top housing panel 44 which together define a housing interior 45. As illustrated in FIG. 5, an elongated axle 60 typically extends through aligned axle openings (not shown) in the respective side panels 42 and spans the housing interior 45. The axle 60 is capable of rotating in the axle openings for purposes hereinafter described. A circular lock plate 64 is mounted on each end of the axle 60, typically by means of an attachment bolt 66, as illustrated in FIG. 4, such that the lock plates 64 are capable of rotating in tandem with each other and the axle 60. It is understood that the lock plates 64 may be rotatably attached to the a respective side housing panels 42 using alternative techniques known by those skilled in the art. An arcuate lock flange 62 is welded or otherwise attached to the lock plate 64. A lock handle 68 is typically attached to each lock flange 62, as illustrated, or alternatively, to the lock plate 64 and spans the lock flanges 62 or lock plates 64 on opposite sides of the support housing 36. Accordingly, the handle 68 can be rotated between the position of FIG. 7B, wherein the lock flange 62 disengages the lock rod shoe 78 of the corresponding lock rod 76 and the docking fixture 34 can be placed on and removed from the test head 92, and the position of FIG. 7A, wherein the lock flange 62 engages the lock rod shoe 78 of the corresponding lock rod 76 and the docking fixture 34 is locked in place on the test head 92, as illustrated in FIG. 5, with the test face 57 of the test device 56 engaging the test face 96 of the test head 92. FIG. 6 illustrates an alternative configuration wherein a lock handle 86 is attached directly to a lock plate 82 and a curved lock flange 84 is provided on the lock plate 82, typically in diametrically-opposed relationship to the lock handle 86.

As further illustrated in FIG. 5, the test device 56 is mounted in the housing interior 45 of the docking fixture 34 typically by means of multiple mounting fasteners 46, each of which may include a head 48 from which extends a shaft 50 downwardly through the top housing panel 44. The head 48 of each mounting fastener 46 may be seated in a corresponding fastener seat (not illustrated) provided in the top housing panel 44. A flange 52 is provided on the shaft 50, and a shank 54 extends beyond the flange 52. The shank 54 is typically threaded for threadibly engaging the corresponding standard threaded fastener opening 59 extending through the test device 56, wherein the flange 52 engages the upper surface of the test device 56. Accordingly, the mounting fasteners 46 mount the test device 56 in a stable functional configuration inside the housing interior 45. It is understood that the test device 56 may be mounted in the housing interior 45 using any of a variety of alternative techniques known by those skilled in the art, the mounting fasteners 46 being one example of a suitable technique.

In application, the docking fixture 34 is capable of securing the test device 56 mounted therein in functional position on the test head 92 to facilitate testing various operational parameters of the parametric wafer testing system 88. This is accomplished by initially positioning the support housing 36 against the test head 92, by inserting standard guide pins 58 extending from the bottom surface of the test device 56 in respective guide pin openings 98 conventionally provided in the test head 92. Accordingly, the test face 57 of the test device 56 functionally engages the test face 96 of the test head 92, as illustrated in FIG. 5, as the test pins 93 of the test device 56 are inserted in and form electrical contact with the respective pin receptacles 94 of the test head 92, as illustrated in FIG. 8A, in conventional fashion. Next, the handle 68 is rotated from the position of FIG. 7B to the position of FIG. 7A, wherein the lock flange 62 of each lock plate 64 engages the lock rod shoe 78 of the corresponding lock rod 76. This locks the docking fixture 34 in place on the test head 92 and the test face 57 of the test device 56 in firm electrical contact with the test face 96 of the test head 92.

After the appropriate diagnostic or testing procedure is carried out according to the knowledge of those skilled in the art by operation of the test device 56, the docking fixture 34 and test device 56 therein are removed from the test head 92. This is accomplished by first rotating the handle 68 from the locking position of FIG. 7A to the unlocking position of FIG. 7B, wherein the lock flange 62 disengages the corresponding lock rod shoe 78. The docking fixture 34 can then be removed from the test head 92 by manually raising the handle 68, wherein the test pins 93 on the test face 57 of the test device 56 are removed from the respective pin receptacles 94 in the test face 96 of the test head 92. Simultaneously, the guide pins 58 on the test device 56 are removed from the respective guide pin openings 98 of the test head 92.

By removably engaging the lock flanges 62 with the respective lock rods 76, the docking fixture 34 of the present invention is capable of removably mounting the test device 56 in functional engagement with the test head 92 without the need for threading fasteners through the test device 56 and into the test head 92. This expedient prevents metal thread particles or filings associated with threaded fasteners from contaminating the test face 96 of the test head 92 during subsequent wafer testing operations using the wafer testing system 88.

While the preferred embodiments of the invention have been described above, it will be recognized and understood that various modifications can be made in the invention and the appended claims are intended to cover all such modifications which may fall within the spirit and scope of the invention.

What is claimed is:

1. A docking fixture for removably mounting a test device in functional engagement with a test head on a wafer testing system, said docking fixture comprising:
    a pair of lock rods for attachment to the test head;
    a support for receiving the test device;
    a pair of lock plates rotatably carried by said support; and
    a pair of lock flanges carried by said pair of lock plates, respectively, for removably engaging said pair of lock rods, respectively, and mounting said support on the test head responsive to rotation of said pair of lock plates, respectively, on said support.

2. The docking fixture of claim 1 further comprising a lock handle carried by said pair of lock plates, respectively, for rotating said pair of lock plates in tandem on said support.

3. The docking fixture of claim 1 wherein said support comprises a support housing comprising front and rear housing panels, a pair of side housing panels and a top housing panel.

4. The docking fixture of claim 3 further comprising a lock handle carried by said pair of lock plates, respectively, for rotating said pair of lock plates in tandem on said support.

5. The docking fixture of claim 1 further comprising an axle rotatably carried by said support and wherein said pair of lock plates is carried by said axle.

6. The docking fixture of claim 5 further comprising a lock handle carried by said pair of lock plates, respectively, for rotating said pair of lock plates in tandem on said support.

7. The docking fixture of claim 5 wherein said support comprises a support housing comprising front and rear housing panels, a pair of side housing panels and a top housing panel.

8. The docking fixture of claim 1 further comprising a plurality of mounting fasteners carried by said support for threadibly engaging the test device.

9. The docking fixture of claim 8 further comprising a lock handle carried by said pair of lock plates, respectively, for rotating said pair of lock plates in tandem on said support.

10. The docking fixture of claim 8 wherein said support comprises a support housing comprising front and rear housing panels, a pair of side housing panels and a top housing panel.

11. The docking fixture of claim 8 further comprising an axle rotatably carried by said support and wherein said pair of lock plates is carried by said axle.

12. A docking fixture for removably mounting a test device in functional engagement with a test head on a wafer testing system, said docking fixture comprising:
    a pair of anchor plates for attachment to the test head;
    a pair of lock rods carried by said pair of anchor plates, respectively;
    a support for receiving the test device;
    a pair of lock plates rotatably carried by said support; and a pair of lock flanges carried by said pair of lock plates, respectively, for removably engaging said pair of lock rods, respectively, and mounting said support on the test head responsive to rotation of said pair of lock plates, respectively, on said support.

13. The docking fixture of claim 12 further comprising a lock handle carried by said pair of lock plates, respectively, for rotating said pair of lock plates in tandem on said support.

14. The docking fixture of claim 12 wherein said support comprises a support housing comprising front and rear housing panels, a pair of side housing panels and a top housing panel.

15. The docking fixture of claim 14 further comprising a lock handle carried by said pair of lock plates, respectively, for rotating said pair of lock plates in tandem on said support.

16. The docking fixture of claim 12 further comprising an axle rotatably carried by said support and wherein said pair of lock plates are carried by said axle.

17. The docking fixture of claim 16 wherein said support comprises a support housing comprising front and rear housing panels, a pair of side housing panels and a top housing panel.

18. The docking fixture of claim 16 further comprising a lock handle carried by said pair of lock plates, respectively, for rotating said pair of lock plates in tandem on said support.

19. The docking fixture of claim 12 further comprising a plurality of mounting fasteners carried by said support for threadibly engaging the test device.

20. A method of removably mounting a test face on a test device in functional engagement with a test face on a test head of a wafer testing system, said method comprising:
   providing a docking fixture comprising a support, a pair of lock plates rotatably carried by said support, and a pair of lock flanges carried by said pair of lock plates, respectively;
   providing a pair of lock rods on the test device;
   mounting the test device on said support;
   positioning the test face of the test device in functional engagement with the test head of the wafer testing system; and
   causing engagement of said pair of lock flanges with said pair of lock rods, respectively, by rotating said pair of lock plates on said support.

\* \* \* \* \*